(12) United States Patent
Coignet et al.

(10) Patent No.: US 11,439,978 B2
(45) Date of Patent: Sep. 13, 2022

(54) METHOD FOR MANUFACTURING A SOLID ADSORBENT FIBER

(71) Applicant: L'Air Liquide, Societe Anonyme pour l'Etude et l'Exploitation des Procedes Georges Claude, Paris (FR)

(72) Inventors: Philippe A. Coignet, Wilmington, DE (US); Dean W. Kratzer, Warwick, MD (US)

(73) Assignee: L'Air Liquide, Societe Anonyme Pour L'Etude Et L'Exploitation Des Procedes Georges Claude, Paris (FR)

( * ) Notice: Subject to any disclaimer, the term of this patent is extended or adjusted under 35 U.S.C. 154(b) by 936 days.

(21) Appl. No.: 16/231,220

(22) Filed: Dec. 21, 2018

(65) Prior Publication Data

US 2019/0201869 A1  Jul. 4, 2019

Related U.S. Application Data

(60) Provisional application No. 62/612,521, filed on Dec. 31, 2017.

(51) Int. Cl.
| | |
|---|---|
| *B01J 20/30* | (2006.01) |
| *B01J 20/28* | (2006.01) |
| *B01D 53/02* | (2006.01) |
| *B01J 20/18* | (2006.01) |
| *B01D 39/02* | (2006.01) |
| *H01B 1/02* | (2006.01) |

(Continued)

(52) U.S. Cl.
CPC .......... *B01J 20/3064* (2013.01); *B01D 39/02* (2013.01); *B01D 53/02* (2013.01); *B01J 20/18* (2013.01); *B01J 20/28023* (2013.01); *B01J 20/28028* (2013.01); *H01B 1/02* (2013.01); *H05K 9/00* (2013.01); *B01D 2239/0407* (2013.01); *B01D 2239/0492* (2013.01); *B01D 2253/108* (2013.01); *B01D 2256/16* (2013.01); *B01D 2257/80* (2013.01); *B01D 2259/4508* (2013.01); *B01J 8/00* (2013.01)

(58) Field of Classification Search
CPC ............................. B01J 20/3064; H01B 1/02
See application file for complete search history.

(56) References Cited

U.S. PATENT DOCUMENTS

| | | | |
|---|---|---|---|
| 2002/0134239 A1* | 9/2002 | Tang | B01J 20/28035 95/90 |
| 2003/0166466 A1* | 9/2003 | Hoke | B01J 20/12 502/439 |

(Continued)

FOREIGN PATENT DOCUMENTS

| | | | |
|---|---|---|---|
| CN | 103480335 | * | 2/2015 |
| WO | WO 98/30326 | | 7/1998 |

(Continued)

OTHER PUBLICATIONS

International Search Report and Written Opinion for PCT/US2018/067364, dated Apr. 9, 2019.

(Continued)

*Primary Examiner* — Nathan T Leong
(74) *Attorney, Agent, or Firm* — Christopher J. Cronin

(57) ABSTRACT

A solid adsorbent fiber includes a solid support fiber that is enveloped by a solidified polymeric binder and also adsorbent particles.

15 Claims, 1 Drawing Sheet

(51) Int. Cl.
*H05K 9/00* (2006.01)
*B01J 8/00* (2006.01)

(56) References Cited

U.S. PATENT DOCUMENTS

| | | | | |
|---|---|---|---|---|
| 2007/0134483 A1* | 6/2007 | Bohringer | .......... | B01J 20/28035 |
| | | | | 428/297.4 |
| 2007/0157588 A1* | 7/2007 | Dauber | ................ | B01D 46/103 |
| | | | | 55/385.6 |
| 2009/0305871 A1* | 12/2009 | Perera | ...................... | D01D 4/02 |
| | | | | 502/60 |
| 2010/0313755 A1 | 12/2010 | Koros et al. | | |
| 2013/0025459 A1* | 1/2013 | Kosuri | ...................... | D01F 9/10 |
| | | | | 96/10 |
| 2016/0303542 A1* | 10/2016 | Harriott | ............. | B01D 53/0407 |

FOREIGN PATENT DOCUMENTS

| | | | |
|---|---|---|---|
| WO | WO1998030326 | * | 7/1998 |
| WO | WO 02/45847 | | 6/2002 |
| WO | WO 2004/003268 | | 1/2004 |
| WO | WO 2007/007051 | | 1/2007 |
| WO | WO 2018/126194 | | 7/2018 |

OTHER PUBLICATIONS

International Search Report and Written Opinion for PCT/US2018/067233, dated Apr. 9, 2019.

* cited by examiner

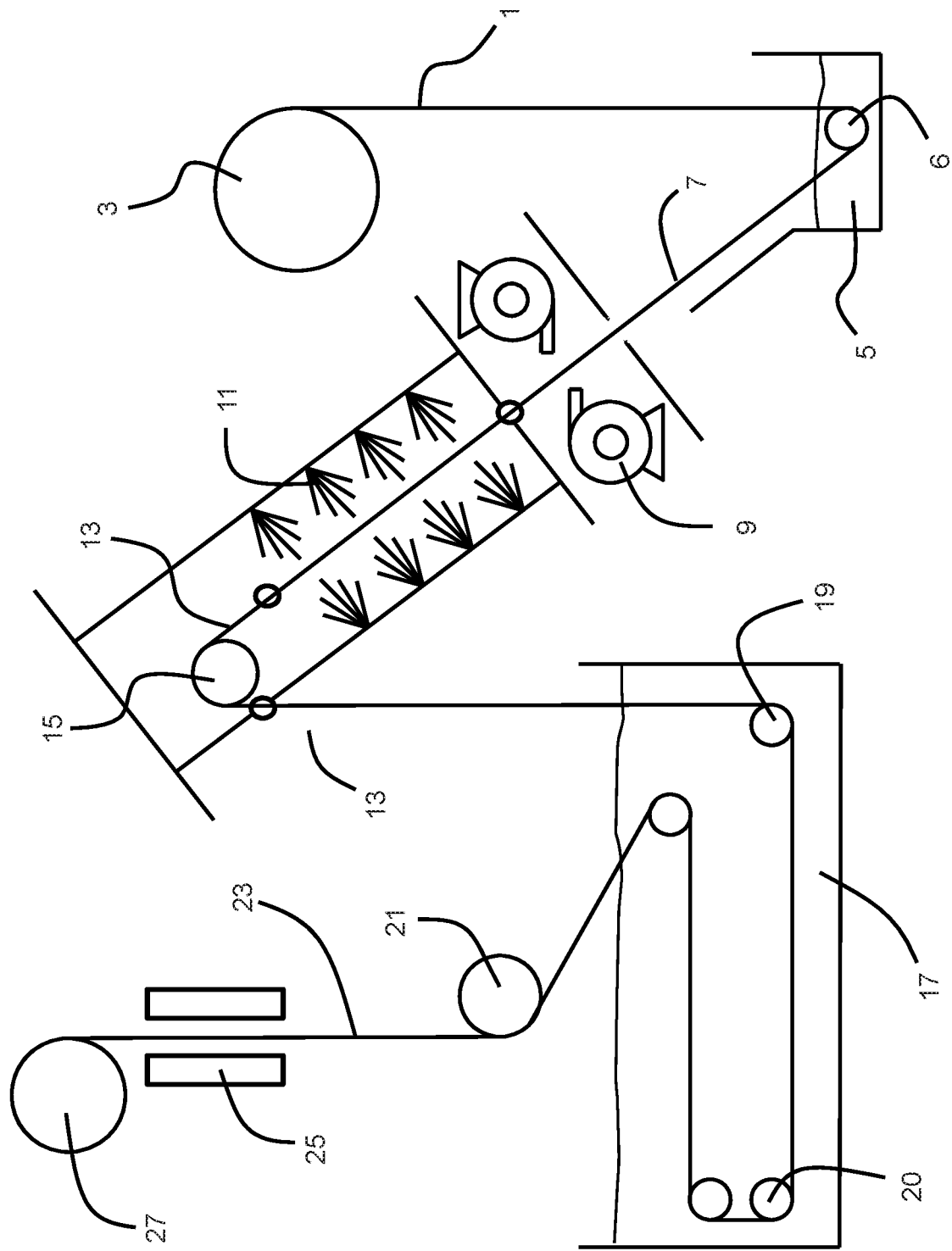

METHOD FOR MANUFACTURING A SOLID ADSORBENT FIBER

CROSS-REFERENCE TO RELATED APPLICATIONS

This application claims the benefit of priority under 35 U.S.C. § 119 (e) to U.S. Provisional Patent Application No. 62/612,521 filed on Dec. 31, 2017, the entire contents of which are incorporated herein by reference.

BACKGROUND

Field of the Invention

The present invention relates to structured adsorbents and fluid separations utilizing the same.

Related Art

Adsorbents are typically shaped as small beads (1-5 mm in diameter) and find widespread use in countless applications, from desiccants for insulated windows to hydrogen purification. Current adsorbent systems, however, include a number of drawbacks.

The packing density of a traditional beaded adsorbent bed is limited by the generally spherical shape of the beads. Specifically, the maximum packing density achievable with perfect spheres of identical diameter is 74%. In reality, within a bed of adsorbent beads a distribution of diameters exists. For example, a ratio of the largest diameter to the smallest diameter is may be around 2:1. Also, beads are not necessarily perfectly spherical, so that often, an average packing density of only as much as 65% is achieved.

Because current beaded adsorbent typically use brittle, clay-based binders, such as bentonite, they are intolerant to friction or impacts and consequently are prone to dusting. Given that current beaded adsorbents are typically intolerant to friction and impacts, it is standard practice to limit the gas velocity seen by the average bead to anywhere between 80 and 90% of the fluidization velocity so that fluidization and dusting are avoided. Because the gas velocity is limited, the flow rates of gas during production and depressurization steps are similarly limited. If the flow rates are limited, the speed at which an adsorbent bed can be depressurized and repressurized is also limited. This is especially true for large PSA systems. Therefore, the throughput of conventional beaded adsorbent beds is limited.

The attrition velocity is an indicator of the maximum gas velocity that the beads of conventional adsorbent beds can be subjected to without exhibiting attrition (i.e., dusting) due to friction and impacts. The attrition velocity is directly linked to the average bead-mass. As the bead mass increases, the attrition velocity increases. Therefore, one way to increase the throughput of a beaded adsorbent bed is to increase the mass of the average bead, or to put it another way, to increase the average diameter of the beads. However, increasing the mass or average diameter of the beads comes at the expense of slower kinetics due to diffusion limitations of gas transport within the beads. This is because, as the mass/diameter of a bead increases, the average path length traveled by a plug of gas from the surface of a bead to an available adsorption site within the bead will also increase.

In order to mitigate some of the above-described drawbacks, some have proposed the use of structured adsorbent beds. As opposed to the discrete structure of a beaded bed, the concept of structured adsorbent bed is to form a rigid and/or fixed adsorbent bed or continuous adsorbent structure so as to eliminate the issues related to fluidization. By doing so, the kinetics can be improved by decreasing the characteristic dimension of the adsorbent structure. As an example, a supported adsorbent layer only 0.1 mm thick can have better kinetics than a similar mass of adsorbent configured as 2 mm beads.

One type of proposed structured adsorbent beds is formed by extruding solid fibers made of adsorbent particles in a polymer matrix. However, as one loads greater and greater amounts of the adsorbent particles in the fiber, discontinuities of the continuous fiber are prevalent during extrusion given the relatively lower amounts of polymer binder present in such fibers. As a result, commercial production of such fibers may limit the amount of adsorbent particle loading in the fiber.

Therefore, there is a need for way to manufacture solid adsorbent fibers on a commercial scale that have higher adsorbent particle loading without suffering from the above-described problem.

SUMMARY

There is disclosed a method of manufacturing supported solid adsorbent fibers, comprising the steps of: dip-coating a solid fiber support with a polymeric dope comprising adsorbent particles and a polymeric binder dissolved in a solvent; and spraying the dip-coated solid fiber support with a coagulant liquid such that the dissolved polymeric binder coated on the solid fiber support as part of the polymeric dope is solidified, thereby producing said solid adsorbent fibers.

The method may include one or more of the following aspects:

gas is blown across the dip-coated solid fiber support upstream of said spraying step so as to drive off any of the coagulant liquid that may have flowed downwardly along the dip-coated fiber toward said dip-coating step.

the polymeric dope is degassed prior to said dip-coating step.

amounts of solvent that may remain in the solid adsorbent fibers are extracted.

the solid fiber support is coated with a functional layer, wherein said functional layer is a selective layer or a protective layer.

the particulate adsorbent is a zeolite that undergoes ionic exchange while in the polymeric dope.

the solid adsorbent fiber is heated to a temperature at or above an activation temperature of the adsorbent particles.

the step of exposing the solid adsorbent fiber to a cross-linking agent is performed prior to said heating step.

the polymeric binder comprises a polymer having a glass transition temperature that is above said activation temperature.

the polymeric binder comprises a polymer having a glass transition temperature that is at or below said activation temperature.

the adsorbent particles are subjected to ion exchange prior to said heating step.

the solid fiber support is coated with an adhesion promoter layer prior to said dip-coating.

the solid fiber support is comprised of a metallic material and the adhesion promoter layer is a polymeric material.

the solid fiber support is comprised of a metallic material and said solid fiber support has been functionalized by chemical exposure to pickle the surface of the solid fiber support.

the solid fiber support is comprised of a polymeric material and an outer surface of said solid fiber support has been functionalized by application of plasma energy.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein:

FIG. 1 is a schematic of an embodiment the inventive method, including optional steps.

DESCRIPTION OF PREFERRED EMBODIMENTS

In the invention, a solid fiber support is dip-coated with a polymeric dope that comprises adsorbent particles suspended in a polymeric binder dissolved in a solvent. After dip-coating, the dip-coated solid fiber support is sprayed with a coagulant liquid such that the dissolved polymeric binder coated on the solid fiber support as part of the polymeric dope is solidified, thereby producing fibers having a coating of adsorbent particles and polymeric binder.

With reference to FIG. 1, a solid support fiber or multi-filament solid support fiber 1 is drawn from a freely rotating spool or mechanically rotated spool 3 and plunged into a coating bath 5 where it is guided around a guide roller 6. A multi-filament fiber 1 may be configured in any way known in the fiber processing field, including twisted filaments and tows of filaments, with or without a different fiber wrapped around them. The coating bath contains a polymeric dope comprised of adsorbent particles suspended in a polymeric binder dissolved in a solvent. In the case of a multi-filament fiber, the guide roller 6 includes grooved filament guides for separation of the individual filaments during the dip coating process. This allows for a more uniform coating of substrate in this process. While FIG. 1 illustrates a roughly 45° angle for the coated fiber 7 exiting the coating bath, the exit angle of coated fiber 7 is at a minimal angle from horizontal to minimizes the chances of the polymeric dope coating of draining back into the coating bath 5. It is within the scope of the invention to provide for only one coating bath or multiple coating baths, in which case the coated fiber 7 exiting one bath is guided around a guide roller before being plunged into a subsequent coating bath 5. In this manner, successive coatings may help to fine-tune the desired coating thickness and/or structure.

The support may optionally be pre coated with an adhesion promoter, solvent/non solvent or a mix thereof, prior to entering the device. The solid support fiber is comprised of one or more organic materials, one or more inorganic materials, or combinations thereof. Typically, the solid support fiber is comprised of one or more metallic materials or one or more thermoplastic polymers. Suitable thermoplastic polymers for use in the solid support fiber include but are not limited to the heat-resistant polymeric binders disclosed in WO 2018/126194.

The types of polymeric binder and solvent suitable for use in the invention are not limited. Typically, the polymeric binder is any type of polymer which may be dissolved in a solvent and subsequently undergo phase inversion through coagulation in a coagulation so as to solidify it. The coagulation bath typically includes water and optionally a solvent that differs from the solvent of the polymeric dope. Particularly suitable types of polymeric binder are disclosed in WO 2018/126194.

Suitable solvents for the polymeric dope include those in which at least 98 wt % of the polymeric binder(s) dissolve. Depending on the polymeric binder(s) chosen and without limiting the scope of the invention, particular solvents include non-polar solvents, polar protic solvents as well as polar aprotic solvents. The latter include N-methyl-2-pyrrolidone (NMP), N,N-Dimethylformamide (DMF), N,N-Dimethylacetamide (DMAc), and N,N-Dimethylsulfoxide (DMSO), and combinations thereof. The solvent may also include an amount of a non-solvent (i.e., one that does not dissolve the polymeric binder(s)), but which is miscible with the solvent, in order to produce a single phase that is close to binodal. The composition of the polymeric binder(s) and solvent is hereinafter referred to as a polymer dope suspension.

The polymeric dope may include one or more salts added to the solvent(s) in order to facilitate the polymer dissolution, such as $CaCl_2$ or LiCl. The combination of solvent(s) and salt(s) should also be selected with the nature of the adsorbent used. For example, it may be desirable to include no salt with certain zeolites in order to prevent any ion exchange processes that would ultimately denature or transform the zeolite. On the other hand, salt(s) may be added so as to intentionally transform the zeolite by ionic exchange while in the adsorbent dope (made up of the polymeric binder(s), solvent(s), optional salts, adsorbent, and optional filler). Alternatively, no salt may be intentionally added to the dope suspension but the coagulated fiber may be subjected to further processing after formation, such as ion exchange in order to obtain the targeted adsorption properties. Such ion exchange processes are well known and maybe applied to the formed fiber without significant modification due to the chemical inertness of the utilized polymer.

The polymeric dope may include one or more organic and/or one or more inorganic fillers. For example, the adsorbent dope may include a filler comprising dry-spun fibrils made of a thermoplastic polymer. Fibrils made by dry-spinning inherently exhibit a high degree of crystallinity. Through inclusion of such high crystallinity fibrils, the flexibility of the inventive fiber may be improved. One type of inorganic filler includes relatively short carbon fiber, such as 5-20 μm long, in amounts up to 20 wt % so as to increase the mechanical properties of the sorbent extrudates. An alternative filler is fiberglass. The organic fillers may be a polymer that is soluble or insoluble in the solvent of the polymeric dope. The insoluble polymeric filler includes but is not limited to dry-spun fibrils made of a thermoplastic polymer. Examples of insoluble polymeric filler include poly(para-aramid) pulp or fibrils, (such as fiber made of Kevlar type 953 at a length of 500-1,000 μm). Inclusion of an insoluble poly(para-aramid) to a dissolved poly(meta-aramid) may allow the poly(para-aramid) to swell and thereby help to lock/entangle the poly(meta-aramid) and poly(para-aramid) polymers chains within one another while improving the mechanical properties of the sorbent extrudates. In order to enhance compatibility of blending insoluble polymeric fillers with the polymer binder of the polymer dope, the insoluble polymeric filler typically belongs to the same general class of polymers as the dissolved thermoplastic polymer in the polymeric dope. The insoluble polymeric filler may be identical to the polymeric binder of the polymeric dope but have a higher molecular weight than that of the soluble thermoplastic polymer or have a higher degree of crystallinity than that of the soluble thermoplastic polymer. For example, a high degree of crystallinity may be achieved with rigid-chain polymers such as in MPD-I fiber produced by dry spinning.

Typically, the adsorbent has a particle size of less than or equal to 100 µm, typically less than or equal to 10 µm, and sometimes even less than or equal to 1 µm. It may be milled in order to achieve the desired size distribution. The type of adsorbent useable in the invention is not limited. Typically, it is any type of adsorbent known in the field of adsorption-based gas separation, such as a zeolite, silica gel, or activated carbon.

The polymeric dope in the coating bath may optionally be degassed under heat and/or vacuum prior to use.

The polymeric dope-coated fiber 7 traverses through a blower apparatus 9, which may include one or more directional air blowers or air knives. The air may be preheated if desired.

The polymeric dope-coated fiber 7 next traverses through a sprayer apparatus 11, which may include one or more directional water sprayers. Alternatively, instead of spraying water, the sprayers may spray any other coagulant medium. Such coagulant media are either poor solvents or non-solvents for the polymeric binder of the polymeric dope. Thus, the primary purpose of the sprayer apparatus 11 is to initiate phase inversion and solidification of the polymeric binder. This allows for achievement of a coating having a more porous asymmetrical structure than would be otherwise achieved using conventional traditional drying columns used for evaporation of the solvent. We believe that this also reduces the thickness of the external skin formed on the coating. Those of ordinary skill in the art will recognize that a reduced thickness skin leads to improved kinetics for the adsorption-based gas separation process because a reduced thickness skin allows for greater flux of gas through the skin. The length of travel through the sprayer apparatus 11, the number of sprayers, and the flow rate of sprayed water or coagulation medium may be adjusted to satisfactorily solidify the coating through phase inversion in order to minimize damage to the coating damage during subsequent processing of the solid coated fiber 13. The sprayer apparatus 11 also includes a rotational guide 15 which may be driven mechanically, pneumatically or free spinning around a shaft and having bearings. This rotational guide 15 is optionally also directly sprayed by the one or more directional sprayers. The sprayer apparatus 11 may optionally include a drip shield to accumulate the excess coagulant medium (e.g. water) and prevent it from draining back into the coating bath 5.

Because the water or coagulant media from the sprayer apparatus 11 may otherwise tend to drain down the polymeric dope-coated fiber 7 and into the coating bath, the one or more air blowers or air knives of the blower apparatus 9 are used to expel any water or coagulant media from the polymeric dope-coated fiber 7 before it can do so. If the water or coagulant media drained back into the coating bath, it would cause phase inversion of the polymeric dope therein.

The solid coated fiber 13 is next plunged into one or more wash baths 17 whose purpose is to effect solvent exchange (i.e., extract solvent) wherein any solvent remaining in or on the solid coating is replaced with a different solvent. The wash bath 13 includes a roller that is submerged within the solvent of the wash bath 17. Optionally and illustrated in FIG. 1, the wash bath 17 may include one or more submerged rollers 20 for increasing the residence time of the solid fiber 13 within the wash bath, thereby achieving more efficient solvent exchange. These submerged rollers 20 may be mechanically driven, pneumatically driven or free spinning around a shaft and having bearings. The wash bath 17 also includes a take-up device 21 receiving the solid fiber from the solvent of the wash bath 17.

Alternatively, the process need not be continuous and the solid fiber 13 may be collected, such as on a spool or in a drum, and temporarily stored before introducing it into the one or more wash baths 17.

Preferably, there are two or more wash baths 17 in which the solvent remaining in or on the solid coating is first replaced with a different solvent in the first wash bath 17 and this different solvent is replaced with yet another different solvent in the second wash bath 17. For example, the solvent in the first wash bath 17 may be water and the solvent in the second wash bath 17 may be one that is more easily evaporated than water, such as an alcohol. Again, although FIG. 1 illustrates a continuous process, it is within the scope of the invention to collect the solvent-washed fiber 23 from the first wash bath 17 and temporarily store it on a spool or in a drum prior to it being solvent-washed in the second wash bath 17.

The solvent-washed fiber 23 is received by a roller 21 and traverses through a drying apparatus 25 to at least partially dry the fiber and at least partially evaporate the solvent from the wash bath 17 (or the last wash bath 17 in the case of two or more wash baths 17). The drying apparatus 25 may include one or more directional air or $N_2$ nozzles directing a flow or flows of dry gas past the solvent-washed fiber 23. The air or $N_2$ may be preheated for more efficient drying. The drying apparatus 25 may also include one or more radiative heaters. The number, size and intensity of any radiative heaters, the number of nozzles, flow rate of the dry gas, and the temperature of the dry gas may be adjusted in order to achieve a satisfactory degree of drying.

While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims. The present invention may suitably comprise, consist or consist essentially of the elements disclosed and may be practiced in the absence of an element not disclosed. Furthermore, if there is language referring to order, such as first and second, it should be understood in an exemplary sense and not in a limiting sense. For example, it can be recognized by those skilled in the art that certain steps can be combined into a single step.

The singular forms "a", "an" and "the" include plural referents, unless the context clearly dictates otherwise.

"Comprising" in a claim is an open transitional term which means the subsequently identified claim elements are a nonexclusive listing i.e. anything else may be additionally included and remain within the scope of "comprising." "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

"Providing" in a claim is defined to mean furnishing, supplying, making available, or preparing something. The step may be performed by any actor in the absence of express language in the claim to the contrary.

Optional or optionally means that the subsequently described event or circumstances may or may not occur. The description includes instances where the event or circumstance occurs and instances where it does not occur.

Ranges may be expressed herein as from about one particular value, and/or to about another particular value. When such a range is expressed, it is to be understood that another embodiment is from the one particular value and/or to the other particular value, along with all combinations within said range.

All references identified herein are each hereby incorporated by reference into this application in their entireties, as well as for the specific information for which each is cited.

What is claimed is:

1. A method of manufacturing supported solid adsorbent fibers, comprising the steps of:
    drawing a solid support fiber or multi-filament solid support fiber from a freely rotating spool or mechanically rotated spool;
    dip-coating a solid fiber support with a polymeric dope by plunging the solid support fiber or multi-filament solid support fiber into a coating bath, thereby providing a polymeric dope-coated solid fiber support, the coating bath containing the polymeric dope, the polymeric dope comprising adsorbent particles and a polymeric binder dissolved in a solvent; and
    spraying the dip-coated solid fiber support with a coagulant liquid bar traversing the polymeric dope-coated solid fiber support through a sprayer such that the dissolved polymeric binder coated on the solid fiber support as part of the polymeric dope is solidified, thereby producing said solid adsorbent fibers.

2. The method of claim 1, further comprising the step of blowing gas across the dip-coated solid fiber support upstream of said spraying step so as to drive off any of the coagulant liquid that may have flowed downwardly along the dip-coated fiber toward said dip-coating step.

3. The method of claim 1, further comprising the step of degassing the polymeric dope prior to said dip-coating step.

4. The method of claim 1, further comprising the step of extracting amounts of solvent that may remain in the solid adsorbent fibers.

5. The method of claim 1, further comprising the step of coating the solid fiber support with a functional layer, wherein said functional layer is a selective layer or a protective layer.

6. The method of claim 1, wherein the particulate adsorbent is a zeolite that undergoes ionic exchange while in the polymeric dope.

7. The method of claim 1, further comprising the step of heating the solid adsorbent fiber to a temperature at or above an activation temperature of the adsorbent particles.

8. The method of claim 7, further comprising the step of exposing the solid adsorbent fiber to a cross-linking agent prior to said heating step.

9. The method of claim 7, wherein the polymeric binder comprises a polymer having a glass transition temperature that is above said activation temperature.

10. The method of claim 7, wherein the polymeric binder comprises a polymer having a glass transition temperature that is at or below said activation temperature.

11. The method of claim 7, wherein the adsorbent particles are subjected to ion exchange prior to said heating step.

12. The method of claim 1, further comprising the step of coating the solid fiber support with an adhesion promoter layer prior to said dip-coating.

13. The method of claim 12, wherein the solid fiber support is comprised of a metallic material and the adhesion promoter layer is a polymeric material.

14. The method of claim 1, wherein the solid fiber support is comprised of a metallic material and said solid fiber support has been functionalized by chemical exposure to pickle the surface of the solid fiber support.

15. The method of claim 1, wherein the solid fiber support is comprised of a polymeric material and an outer surface of said solid fiber support has been functionalized by application of plasma energy.

* * * * *